United States Patent [19]

Kerber

[11] Patent Number: 5,061,357

[45] Date of Patent: Oct. 29, 1991

[54] METHOD OF PRODUCING AN ELECTRON BEAM EMISSION CATHODE

[75] Inventor: Susan J. Kerber, Sussex, Wis.

[73] Assignee: Midwest Research Technologies, Inc., Milwaukee, Wis.

[21] Appl. No.: 597,498

[22] Filed: Oct. 15, 1990

[51] Int. Cl.$^5$ ............................................. C23C 14/34
[52] U.S. Cl. ............................................. 204/192.15
[58] Field of Search ................................... 204/192.15

[56] References Cited

FOREIGN PATENT DOCUMENTS 49-122958  11/1974  Japan ............................. 204/192.15

*Primary Examiner*—Aaron Weisstuch
*Attorney, Agent, or Firm*—Andrus, Sceales, Starke & Sawall

[57] ABSTRACT

A coating of lanthanum hexaboride $LaB_6$ is sputtered on a substrate, preferably an electrically conductive substrate such as tungsten, in an insert gas atmosphere and at a pressure in the range of 2 to $50 \times 10^{-3}$ torr. The coated substrate is subsequently heated to a temperature in the range of 750° C. to 1000° C. in a non-oxidizing atmosphere to provide an adherent, dense, smooth $LaB_6$ coating on the substrate, suitable for use as an electron beam emission cathode.

12 Claims, No Drawings

METHOD OF PRODUCING AN ELECTRON BEAM EMISSION CATHODE

BACKGROUND OF THE INVENTION

Thermionic emission is defined as the outflow of electrons into vacuum from a substance as a result of heat. The phenomenon of thermionic emission is related to the work function of the material which is the minimum energy needed to remove an electron from the Fermi level of the substrate to infinity. Because the work function of lanthanum hexaboride ($LaB_6$) is relatively low, it has been used in the past as an electron source, such as an electron beam emission cathode. $LaB_6$ has been used either as a single crystal of $LaB_6$ or in the form of a sintered rod. The single crystal tip provides better emission qualities, i.e. higher current in smaller areas at lower temperatures, but is more expensive than the sintered rod. However, both the single crystal and the sintered rod must be indirectly heated, which complicates the engineering and design.

In the past it has also been proposed to produce an electron beam emission cathode by coating metal filaments with $LaB_6$ through use of an electrophoretically deposited coating. While filaments of this type are relatively simple in design, they are mechanically fragile and prone to spalling of the coating which reduces the service life of the coated filament. As a further disadvantage, electrophoretically coated filaments have a relatively rough surface which can result in stray emissions which detracts from the performance of the cathode.

It is also known to coat materials by radio frequency magnetron sputter deposition. Sputtering is a thin film deposition process that is based on the bombardment of a target of a source material with positive ions from a plasma. The plasma is formed by applying a high voltage between the cathode, which is the metal to be deposited, and the anode or substrate in a high vacuum system, backfilled with an inert sputtering gas, such as argon. Positive ions in the plasma are attracted to the negative potential on the cathode or target and cause ejection of the target material by momentum transfer. The ejected material is deposited onto the substrate.

Radio frequency sputtering has been used for the deposition of thin films in the production of devices, such as capacitors, resistors, transistors, and the like.

SUMMARY OF THE INVENTION

The invention is directed to a method of producing an electron beam emission cathode through use of a sputtering process. In the process, $LaB_6$ is the cathode or target, and in the preferred form of the invention, a layer of sintered $LaB_6$ is bonded to an electrically conductive material, such as a backing of copper, by an electrically conductive adhesive. A metal filament, such as tungsten or rhenium, is the anode. The target and anode are located in a sputtering chamber and the chamber is evacuated to approximately a $10^{-7}$ torr range. The sputtering chamber is then back filled with an inert gas, such as argon, to a pressure generally in the range of 2 to $50 \times 10^{-3}$ torr.

A potential is then applied between the cathode and anode, forming a plasma and positive ions in the plasma are attracted to the negative potential on the $LaB_6$ which causes the $LaB_6$ to be deposited onto the metal substrate or anode, thus providing a coating of $LaB_6$ on the metal anode with a thickness generally in the range of 1 to 3 microns.

In accordance with the method of the invention, the coated filament is then heated to a temperature in the range of 750° to 1000° C. for a period of about one-half hour under non-oxidizing conditions. The non-oxidizing conditions can be obtained by heating under sub-atmospheric pressure in the presence of an inert gas, such as argon. The heating causes lanthanum to segregate toward the surface of the coating, which improves the performance of the coated filament.

The resulting sputter deposited $LaB_6$ coating is adherent and smoother than coatings deposited by electrophoretic methods, thus improving the overall emission characteristics of the $LaB_6$ coated filament.

The sputter deposited coating has a work function and stoichiometry similar to bulk $LaB_6$. The $LaB_6$ coating is non-porous so there is limited out-gassing when the coated filament is used as an emission cathode.

As a further advantage, the coated filaments are flexible and can be flexed with moderate severity without exhibiting micro-cracking, spalling, or a difference in emission characteristics.

The coated filament of the invention can be used in instruments which use thermionic emission for an electron source. Specific applications are medical imaging, ion lasers, high density plasma guns, electron optics, klystrons, traveling wave tubes, neon signs, and the like.

DESCRIPTION OF THE PREFERRED EMBODIMENT

The electron beam emission cathode of the invention is produced through a radio frequency magnetron sputter deposition process. In the process, $LaB_6$ is the cathode or target, while the substrate to be coated is the anode. In a preferred form of the invention, $LaB_6$, in the form of a sintered layer, is bonded through an electrically conductive adhesive to a metallic backing member, such as copper. The substrate or anode can be in the form of a metal filament having a diameter in the range of 8 to 30 mils, and can be composed of tungsten or rhenium, although in some instances the substrate can be a non-conductive material, such as a ceramic. In general, the anode or substrate should have a coefficient of expansion which is similar to that of $LaB_6$ and should not deform at working temperatures in the range of 1000° C. to 1200° C.

The target or cathode and anode are placed in the sputtering chamber and the chamber is then evacuated to approximately a $10^{-7}$ torr range. The sputtering chamber is then back filled with an inert gas, such as argon, at a pressure ranging from about 2 to $50 \times 10^{-3}$ torr. It has been found that the pressure of the inert gas is an important factor. If the pressure is outside of the above mentioned range, an acceptable deposited coating cannot be obtained.

A high voltage is applied between the cathode or target and the anode, and in practice a potential in the range of about 100 to 1000 volts can be used. The voltage results in positive ions in the plasma being attracted to the negative potential on the $LaB_6$ target, causing ejection of the $LaB_6$ material by momentum transfer. The $LaB_6$ is thus deposited onto the anode or substrate to provide an adherent, dense and smooth coating.

During the sputtering process, a biasing voltage, generally in the range of 0 to 50 volts can be applied to the substrate. The biasing voltage can act to remove weakly bonded lanthanum and boron atoms from the substrate to provide a more uniform coating.

The resulting coating of $LaB_6$ on the substrate has a thickness generally in the range of 2500 Angstroms to 15 microns and preferably in the range of 1 to 3 microns.

The coated substrate when removed from the sputtering chamber, is at a temperature of about 50° C. to 150° C. as a result of the heat generated during the sputtering process.

The coated substrate is then subjected to a heating process which consists of heating the coated substrate to a temperature in the range of 750° C. to 1000° C., and preferably about 800° C. for a period of about one-half hour. The heating is carried out under sub-atmospheric pressure, generally less than $10^{-2}$ torr, and in a non-oxidizing atmosphere, which is preferably achieved by introducing an inert gas, such as argon, in the heating chamber. Both lanthanum and boron tend to oxidize at higher temperatures, so that it is essential that the heating be carried out under non-oxidizing conditions. During the heating process, the lanthinum migrates to the outer surface of the coating which acts to improve the emission characteristics of the coated filament.

After the heating treatment the coated substrate is cooled to room temperature and the rate of cooling is not critical.

A specific example of carrying out the method of the invention is as follows:

A disc of sintered $LaB_6$ 8 inches in diameter and $\frac{1}{4}$ thick was produced. The disc was composed of 99.5% $LaB_6$ with the most significant impurities being 0.0328% iron and 0.023% calcium.

The $LaB_6$ disc was bonded to a copper backing plate by an electrically conductive epoxy adhesive and the resulting composite structure was loaded into a Materials Research Corporation Model 822RF magnetron sputtering chamber. A substrate in the form of tungsten ribbon having a thicknbess of 0.005 inch, a width of 0.040 inch and a length of one inch, was used as the anode in the sputtering chamber.

The chamber was evacuated with a cryopump to a pressure of approximately $10^{-7}$ torr. The chamber was then throttled and back filled with 99.99% argon to a pressure in the range of $20 \times 10^{-3}$ torr. A radio frequency forward power of approximately 1000 watts was applied between the cathode and anode to generate a plasma and a resulting deposition of $LaB_6$ on the tungsten filament. The coating on the tungsten filament had a thickness of 2 microns.

The coated tungsten filament was removed from the sputtering chamber and loaded in a heating chamber. The chamber was evacuated to a pressure of $10^{-8}$ torr, and then heated to a temperature of 800° C. for one-half hour. After the heating, the coated filament was cooled to room temperature.

The coated filament was subsequently subjected to x-ray diffraction to compare the crystallography of bulk $LaB_6$ to the deposited film or coating. A General Electric diffractometer with a copper target (40 kv) and a nickel filter was used. The result showed that the deposited $LaB_6$ coating had a pattern similar to that of bulk $LaB_6$ and no peaks due to oxides of lanthanum or boron were noted.

A JEOL 35C scanning electron microscope was used to inspect the surfaces and cross sections of the deposited $LaB_6$ film. In general the films had a dense columnar structure.

Electron microscopy was also performed after filament flexing experiments. The tungsten filament was flexed in the concave direction and in the convex direction a total of 20 times through a radius of curvature of $\frac{1}{2}$ inch. A second coated filament was not flexed. Inspection of the surfaces of both the flexed and non-flexed coated filament indicated that there was no microcracking or spalling visible after flexing.

The coated tungsten filament was also subjected to emission testing and the work function value of the $LaB_6$ coated filament was comparable to those of single crystal $LaB_6$, or sintered powder $LaB_6$. At 1100° C. the emission density of the $LaB_6$ coated tungsten filament was $10^{-1}$ amps/cm$^2$, while the emission density of uncoated tungsten filament was $10^{-7}$ amps/cm$^2$. The coated filament ran 1000 hours without any reduction in the emission current.

Through the method of the invention, a more adherent, dense, and smooth coating of $LaB_6$ can be produced on the substrate which improves the overall emission characteristics of the cathode.

The sputter deposited $LaB_6$ coating is superior to other forms of coatings, because there are no electrolytes employed in the process which can preferentially react with either the lanthanum or the boron. Further, the $LaB_6$ coating is essentially non-porous, for the coating is applied in a high vacuum condition, so that there is limited out-gassing.

In addition, the $LaB_6$ coating is similar in work function and stoichiometry to bulk $LaB_6$, and the emission density of the coating is comparable to that obtained through use of bulk $LaB_6$ or a sintered $LaB_6$ rod.

Various modes of carrying out the invention are contemplated as being within the scope of the following claims particularly pointing out and distinctly claiming the subject matter which is regarded as the invention.

I claim:

1. A method of producing an electron beam emission cathode, comprising the steps of depositing a coating of $LaB_6$ on a substrate by sputter deposition to provide a coated substrate, and thereafter heating the coated substrate to a temperature in the range of 750° C. to 1000° C. in a non-oxidizing atmosphere.

2. The method of claim 1, wherein the step of depositing a coating comprises disposing a mass of $LaB_6$ in a chamber in spaced relation to the substrate, drawing a vacuum in said chamber, backfilling the chamber with an inert gas and maintaining the pressure of the gas at a value of 2 to $50 \times 10^{-3}$ torr, and subjecting the $LaB_6$ and the substrate to an electrical potential with said $LaB_6$ being a cathode and said substrate being an anode to thereby deposit $LaB_6$ on said substrate.

3. The method of claim 2, wherein said $LaB_6$ comprises a sintered mass.

4. The method of claim 2, wherein said inert gas is argon.

5. The method of claim 1, wherein said substrate is a material having a coefficient of expansion similar to $LaB_6$ and capable of not deforming at operating temperatures in the range of 1000° C. to 1200° C.

6. The method of claim 1, wherein the substrate is a metal.

7. The method of claim 6, wherein said metal is selected from the group consisting of tungsten and rhenium.

8. A method of producing an electron beam emission cathode, comprising the steps of positioning a mass of $LaB_6$ in a sputtering chamber in spaced relation to a substrate, evacuating the chamber, introducing an inert gas into the evacuated chamber and maintaining the inert gas at a pressure in the range of 2 to $50 \times 10^{-3}$ torr, subjecting the mass of $LaB_6$ and the substrate to an electrical potential with said mass constituting a cathode and said substrate constituting an anode to thereby deposit a coating of $LaB_6$ on said substrate, and heating the coated substrate in a non-oxidizing atmosphere to a temperature in the range of 750° C. to 1000° C.

9. The method of claim 8, wherein the step of heating the coated substrate is in the presence of an inert gas to provide said non-oxidizing atmosphere.

10. The method of claim 9, wherein the inert gas during the step of heating is maintained at a pressure less than $1 \times 10^{-2}$ torr.

11. The method of claim 8, wherein said substrate comprises a metal filament having a diameter in the range of 8 to 30 mils.

12. The method of claim 11, wherein said metal is selected from the group consisting of tungsten and rhenium.

* * * * *